(12) United States Patent
Cho

(10) Patent No.: US 7,642,177 B2
(45) Date of Patent: Jan. 5, 2010

(54) METHOD OF MANUFACTURING NANOWIRE

(75) Inventor: Hans S. Cho, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 306 days.

(21) Appl. No.: 11/643,706

(22) Filed: Dec. 22, 2006

(65) Prior Publication Data
US 2007/0145375 A1    Jun. 28, 2007

(30) Foreign Application Priority Data
Dec. 28, 2005    (KR) .................. 10-2005-0131882

(51) Int. Cl.
*H01L 21/20*    (2006.01)
(52) U.S. Cl. .................. 438/489; 438/486; 438/692; 257/E21.193; 977/762
(58) Field of Classification Search ......... 438/690–692, 438/486–489, 760, 674; 257/E21.193; 977/762
See application file for complete search history.

(56) References Cited

U.S. PATENT DOCUMENTS 7,425,491 B2 * 9/2008 Forbes .................. 438/301

2007/0228523 A1 * 10/2007 Sharma .................. 257/618
2008/0277737 A1 * 11/2008 Madakasira .................. 257/382

* cited by examiner

*Primary Examiner*—Thanh Nguyen
(74) *Attorney, Agent, or Firm*—Harness, Dickey & Pierce, P.L.C.

(57) ABSTRACT

A method of manufacturing a nanowire, a method of manufacturing a semiconductor apparatus including a nanowire and a semiconductor apparatus formed from the same are provided. The method of manufacturing a semiconductor apparatus may include forming a material layer pattern on a substrate, forming a first insulating layer on the material layer pattern, a first nanowire forming layer and a top insulating layer on the substrate, wherein a total depth of the first insulating layer and the first nanowire forming layer may be formed to be smaller than a depth of the material layer pattern, sequentially polishing the top insulating layer, the first nanowire forming layer and the first insulating layer so that the material layer pattern is exposed, exposing part of the first nanowire forming layer to form an exposed region and forming a single crystalline nanowire on an exposed region of the first nanowire forming layer.

18 Claims, 12 Drawing Sheets

METHOD OF MANUFACTURING NANOWIRE

PRIORITY STATEMENT

This application claims priority under 35 U.S.C. § 119(a) to Korean Patent Application No. 10-2005-0131882, filed on Dec. 28, 2005, in the Korean Intellectual Property Office (KIPO), the entire contents of which are incorporated herein by reference.

BACKGROUND

1. Field

Example embodiments relate to a method of manufacturing a silicon nanowire, a method of manufacturing a semiconductor apparatus including a silicon nanowire and the semiconductor apparatus formed from the same.

2. Description of the Related Art

Nanotechnology is defined as the scientific technology of manufacturing, analyzing and controlling materials at dimensions on a nanometer scale, thereby manufacturing the materials, devices or systems with novel or improved physical, chemical and biological properties. As nanotechnology has been developed, various nanostructures have been introduced. Nanotubes and nanowires may be typical nanostructures.

Carbon nanotubes may be known as nanotubes. Nanowires may be useful in a variety of fields of lasers, transistors, memory devices and/or chemical detecting sensors. Nanowire manufacturing technology may control the length of a nanowire. For example, the length of a nanowire may be controllable from about five nanometers to about several hundreds of nanometers.

Nanowires may be manufactured by a catalytic growth method. In a method of manufacturing a nanowire using a catalyst (hereinafter, referred to as "conventional method"), after a nanowire is formed in a predetermined or given length, the used catalyst may be removed. In the conventional method, it may be relatively difficult to completely remove the used catalyst and thus part of the essentially used catalyst may remain as impurities. In the conventional method, because it is relatively difficult to control the growth of a nanowire, it may also be relatively difficult to form a nanowire at a predetermined or given position.

SUMMARY

Example embodiments relate to a method of manufacturing a nanowire, method of manufacturing a semiconductor apparatus including a nanowire and a semiconductor apparatus formed from the same.

According to example embodiments, a method of manufacturing a semiconductor apparatus including a single crystalline nanowire may include forming a material layer pattern on a substrate, forming a first insulating layer covering the material layer pattern, a first nanowire forming layer and a top insulating layer on the substrate, wherein a total depth of the first insulating layer and the first nanowire forming layer may be formed to be smaller than a depth of the material layer pattern, polishing the top insulating layer, the first nanowire forming layer and the first insulating layer so that the material layer pattern is exposed, exposing part of the first nanowire forming layer to form an exposed region and forming a single crystalline nanowire on an exposed region of the first nanowire forming layer.

The substrate may be formed of one selected from the group consisting of a silicon oxide, quartz and glass. The first insulating layer may be composed of a material having a lower reaction rate to a source gas used for single crystalline nanowire formation, than a reaction rate of the first nanowire forming layer. The first nanowire forming layer may be a silicon nitride layer. Forming the first insulating layer, the first nanowire forming layer and the top insulating layer may further include forming a second insulating layer and a second nanowire forming layer between the first nanowire forming layer and the top insulating layer, wherein a total depth of the first insulating layer, the first nanowire forming layer, a second insulating layer and a second nanowire forming layer may be formed to be smaller than a depth of the material layer pattern.

The second insulating layer may be composed of a material having a lower reaction rate to a source gas used for the single crystalline nanowire formation, than a reaction rate of the second nanowire forming layer. The second nanowire forming layer may be a silicon nitride layer. The first nanowire forming layer may be formed to a thickness within the range of about 1 nm-about 100 nm. The second nanowire forming layer may be formed to a thickness within the range of about 1 nm-about 100 nm. The first nanowire forming layer and the second nanowire forming layer may be formed to a different thickness from each other. The single crystalline nanowire may be one selected from the group consisting of a silicon (Si) nanowire, a germanium (Ge) nanowire and a silicon germanium (SiGe) nanowire. The exposed region of the first nanowire forming layer may have a desired length and a nano-width.

Forming the single crystalline nanowire may further include forming a polycrystalline nanowire on the exposed region of the first nanowire forming layer; and irradiating a laser beam to the polycrystalline nanowire. The polycrystalline nanowire may be formed by supplying a precursor including a group IV semiconductor element as a source gas in ultrahigh vacuum chemical vapor deposition equipment. Forming the material layer pattern may include forming at least two material layer patterns spaced apart from each other on the substrate. According to example embodiments, irradiating the laser beam may include irradiating the laser beam to a remaining part of the polycrystalline after removing a part of the polycrystalline nanowire. According to example embodiments, irradiating the laser beam may include removing a part of the single crystalline nanowire after irradiating the laser beam to the polycrystalline.

According to example embodiments, a method of manufacturing a nanowire may include forming a polycrystalline nanowire on a substrate and changing the polycrystalline nanowire to a single crystalline nanowire. Forming the polycrystalline nanowire may include forming a plurality of the polycrystalline nanowires to be spaced apart from one another on the substrate. Forming the polycrystalline nanowire may further include sequentially forming a nanowire forming layer and an insulating layer on the substrate, patterning the nanowire forming layer and the insulating layer in reverse order, and exposing sides of the nanowire forming layer, selectively forming the polycrystalline nanowire on an exposed sides of the nanowire forming layer and removing the insulating layer and the nanowire forming layer.

Changing the polycrystalline nanowire to the single crystalline nanowire may further include irradiating a laser beam to the polycrystalline nanowire. Removing the insulating layer and the nanowire forming layer may be performed after changing the polycrystalline nanowire to the single crystalline nanowire. Changing the polycrystalline nanowire to the single crystalline nanowire may further include irradiating a laser beam to the polycrystalline nanowire.

According to example embodiments, a semiconductor apparatus including a single crystalline nanowire may include a material layer pattern on a substrate, a first insulating layer on the material layer pattern and a first nanowire forming layer and a top insulating layer on the substrate, wherein a total depth of the first insulating layer and the first nanowire forming layer is smaller than a depth of the material layer pattern and a single crystalline nanowire on an exposed region of the first nanowire forming layer.

In accordance with example embodiments, impurities may not be included in a finally obtained nanowire. Nanowires in various shapes may be obtained, to be applied to various devices. Nanowires having various diameters (about 1 nm~about 100 nm) may be more easily manufactured. Manufacturing cost may be reduced and manufacturing processes may be simplified. Various kinds of substrates, for example, a crystalline substrate and/or an amorphous substrate, may be used. Also, single crystalline nanowires may be obtained.

BRIEF DESCRIPTION OF THE DRAWINGS

Example embodiments will be more clearly understood from the following detailed description taken in conjunction with the accompanying drawings.

FIGS. 1-13 are diagrams illustrating, by sequential processes, a method of manufacturing a nanowire according to example embodiments; and FIGS. 14-20 are diagrams illustrating, by sequential processes, a method of manufacturing a nanowire according to other example embodiments.

DETAILED DESCRIPTION OF EXAMPLE EMBODIMENTS

Figure 1:
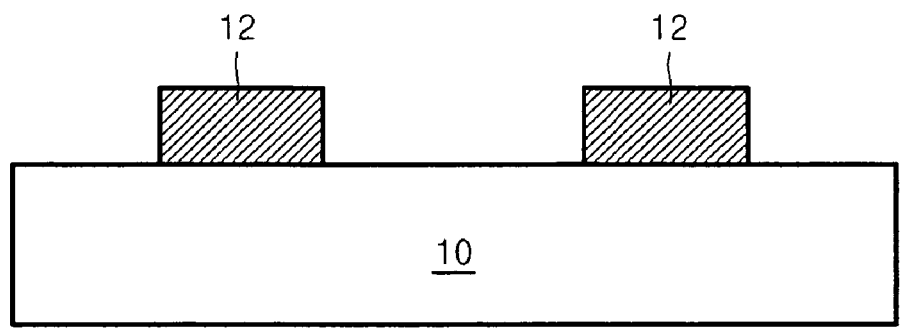
FIGS. 1-20 represent non-limiting, example embodiments as described herein.

Example embodiments will now be described more fully hereinafter with reference to the accompanying drawings, in which preferred embodiments are shown. Example embodiments may, however, be embodied in many different forms and should not be construed as being limited to the embodiments set forth herein. Rather, these embodiments are provided so that this disclosure will be thorough and complete, and will fully convey the scope of example embodiments to those skilled in the art. In the drawings, the thicknesses of layers and regions are exaggerated for clarity. Like reference numerals refer to like elements throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. The example term "below" may encompass both an orientation of above and below. The device may be otherwise oriented (rotated 90° or at other orientations) and the spatially relative descriptors used herein interpreted accordingly.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising," "includes" and/or "including", when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A method of manufacturing a nanowire according to example embodiments will be described with reference to FIGS. 1-13. Referring to FIG. 1, a region where a nanowire is to be formed and a region where a nanowire is not to be formed may be defined and spaced from each other on a substrate 10. Mesa patterns 12 may be formed on the region of the substrate 10 where a nanowire is not formed. A top surface of the mesa pattern 12 may be exposed in a subsequent process. The mesa pattern 12 may be composed of a material which does not react to a precursor material used for nanowire formation. For example, when a nanowire is a silicon nanowire, the mesa pattern 12 may be formed of, for example, a silicon oxide layer, quartz and/or glass, which does not react to silane ($SiH_4$) as the precursor. A space between the mesa patterns 12 may be wider or narrower according to the size of the region where a nanowire is formed. The width of the mesa pattern 12 may be wider or narrower.

Figure 2:
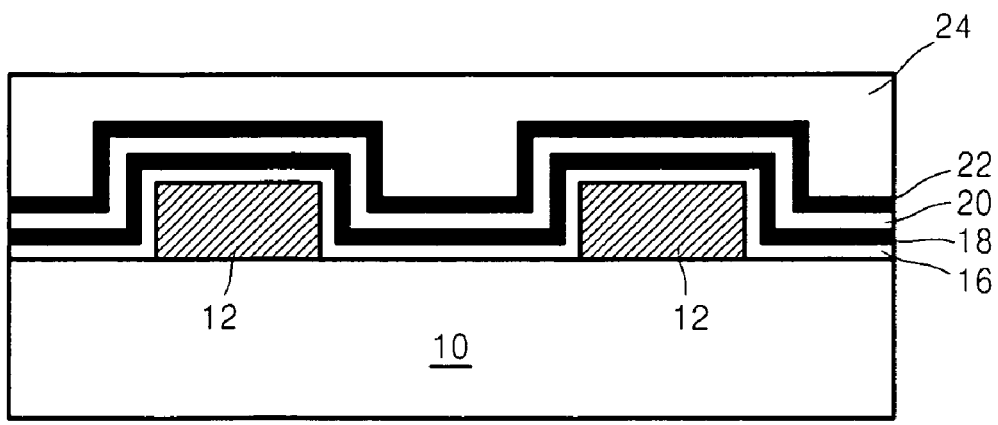

Referring to FIG. 2, a first insulating layer 16 may be formed to cover the mesa patterns 12 on the substrate 10. A first nanowire forming layer 18, a second insulating layer 20 and a second nanowire forming layer 22 may be sequentially formed on the first insulating layer 16. The total depth of the first insulating layer 16, the first nanowire forming layer 18, the second insulating layer 20, and the second nanowire forming layer 22 may be smaller than the depth of the mesa pattern 20. After a top insulating layer 24 is formed on the second nanowire forming layer 22, a top surface of the top insulating layer 24 may be planarized. The first and second insulating layers 16 and 20 and the top insulating layer 24 may be formed, using an insulating layer having a much lower selectivity of the nanowire precursor material, than the first and second nanowire forming layers 18 and 22. The first and second insulating layers 16 and 20 and the top insulating layer 24 may be, for example, a silicon oxide layer ($SiO_2$). The first and second nanowire forming layer 18 and 22 may be a silicon nitride layer ($SiN_x$).

In a subsequent process, a nanowire may be selectively formed on sections of the first and second nanowire forming layer 18 and 22. Because the diameter of a single crystalline nanowire to be formed depends on the thickness of the first and second nanowire forming layers 18 and 22, the first and second nanowire forming layers 18 and 22 may be formed to a thickness to conform with the diameter of the nanowire to be formed. For example, when the diameter of the nanowire to be formed is less than about 10 nm, the thickness of the first and second nanowire forming layers 18 and 22 may be less than about 10 nm. The first and second nanowire forming layers 18 and 22 may be formed to a thickness of about 100 nm or less. The planarized top surface of the top insulating layer 24 may be polished. The polishing may be performed using a desired method, for example, a chemical mechanical polishing (CMP) method. The polishing may be performed until the top surface of the mesa patterns 12 is completely exposed, as illustrated in FIG. 3.

Figure 3:
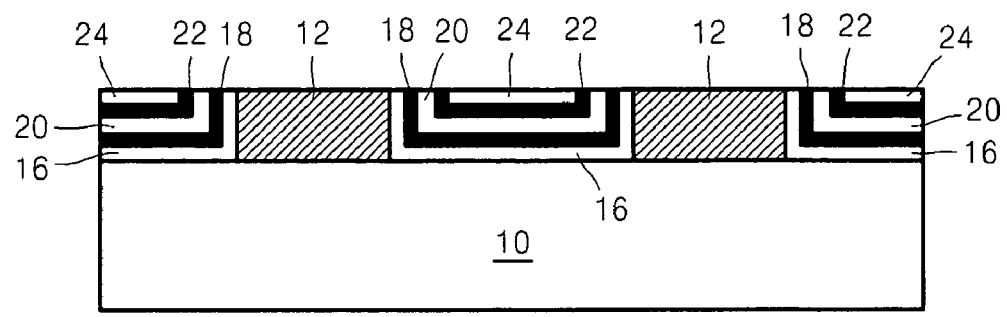

Referring to FIG. 3, the first and second insulating layers 16 and 20, the top insulating layer 24, and the first and second nanowire forming layers 18 and 22 may be removed from the top surface of the mesa patterns 12 through the polishing process. The first and second insulating layers 16 and 20, the top insulating layer 24, and the first and second nanowire forming layers 18 and 22, which may be formed between the mesa patterns 12 at the same height as the mesa patterns 12, may be removed. A level including the top surface of the mesa patterns 12 may be formed through the polishing process. The first and second insulating layers 16 and 20, the top insulating layer 24, and the first and second nanowire forming layers 18 and 22 may be separated by the mesa patterns 12.

Figure 4:
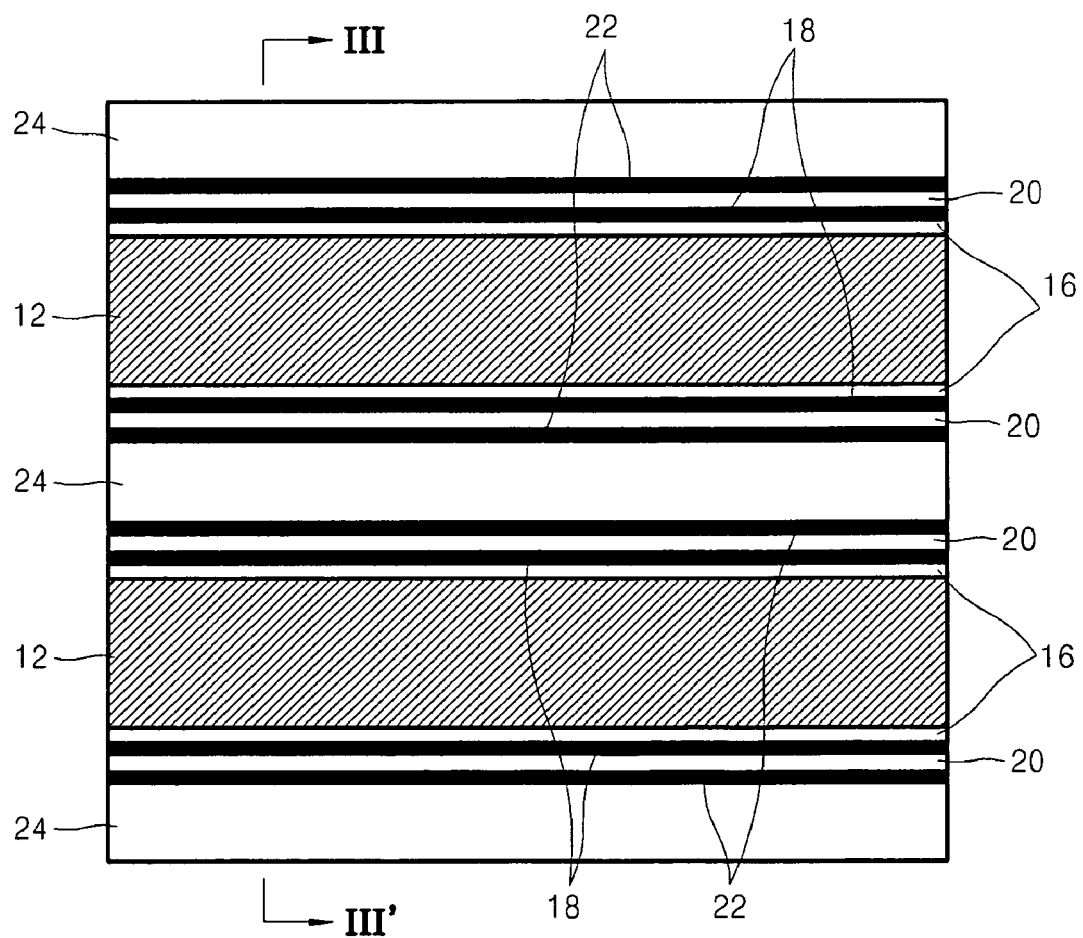

FIG. 4 is a diagram of the result after the polishing process. FIG. 3 illustrates a section of FIG. 4 cut in direction III-III'. Referring to FIG. 4, the mesa patterns 12 may be linearly formed, and the first and second nanowire forming layers 18 and 22 may be linearly exposed to be parallel to the mesa patterns 12. The exposed regions of the first and second nanowire forming layers 18 and 22 in FIG. 4 correspond to horizontal sections of vertical portions of the first and second nanowire forming layers 18 and 22 in FIG. 2. The widths of the exposed regions of the first and second nanowire forming layers 18 and 22 illustrated in FIG. 4 may be the same as the thickness of the first and second nanowire forming layers 18 and 22. In a subsequent process, a nanowire may be selectively formed on the exposed regions of the first and second nanowire forming layers 18 and 22. As described above, the thickness of the first and second nanowire forming layers 18 and 22 may be formed to conform to the diameter of the nanowire to be formed.

Figure 5:
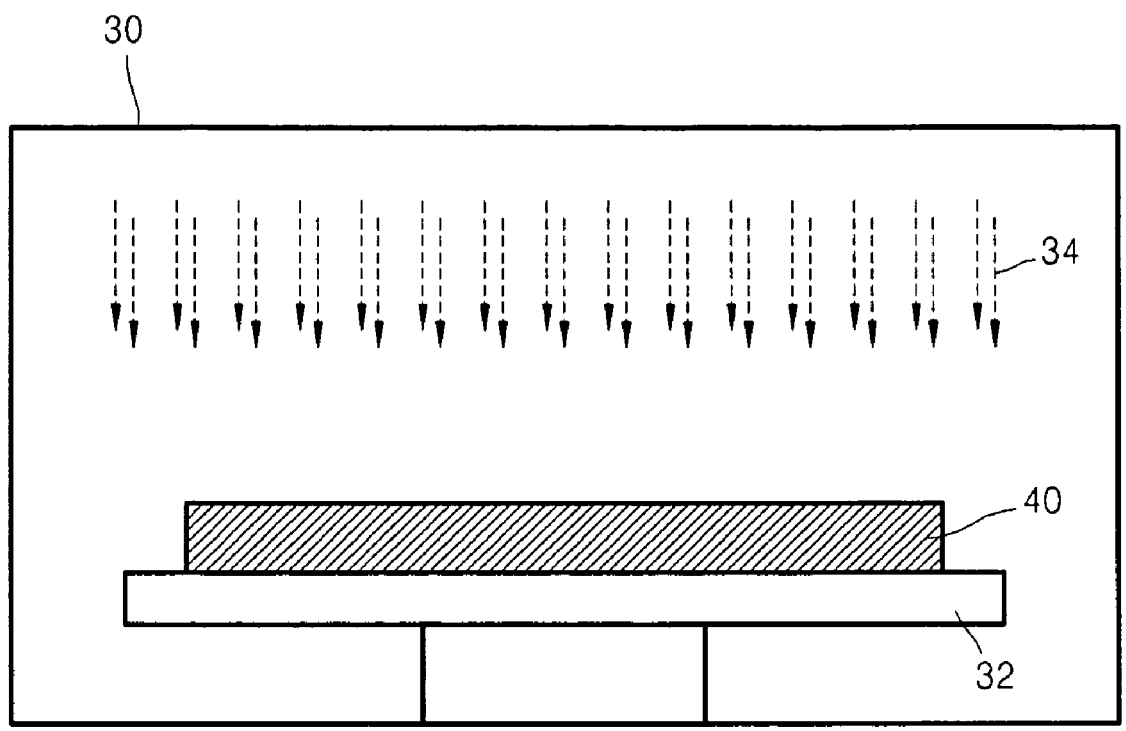

In FIG. 5, the resultant 40 of FIG. 3 may be loaded on a stage 32 in an ultrahigh vacuum chemical vapor deposition (UHV-CVD) chamber 30. A material 34 (hereinafter, referred to as a "source material") to form the nanowire may be supplied to the UHV-CVD chamber 30 evenly spread on the resultant 40. The temperature inside the UHV-CVD chamber 30 may be maintained to be suitable for nanowire growth. For example, when the silicon nanowire is formed, the inside temperature may be maintained at about 600° C. or higher, and the inside pressure may be maintained at about $10^{-4}$ torr or lower. A doping material (not shown) may be supplied to the UHV-CVD chamber 30, together with the source material 34. The doping material may be a general p-type and/or n-type doping gas. The source material 34 may be a precursor including a group IV element on the periodic table, and it may be a material to be melted by a laser beam, for example, an Excimer laser beam. For example, when a silicon (Si) nanowire is formed, silane may be used. When a germanium (Ge) nanowire and/or a silicon germanium (SiGe) nanowire is formed, a precursor material including germanium (Ge) or silicon germanium (SiGe) may be used. As described above, the first and second insulating layers 16 and 20 and the top insulating layer 24 may have a lower selectivity than the source material 34, than the first and second nanowire forming layers 18 and 22. The source material 34 may be vapor-deposited only on the exposed regions of the first and second nanowire forming layers 18 and 22 during the vapor-deposition process.

Figure 6:
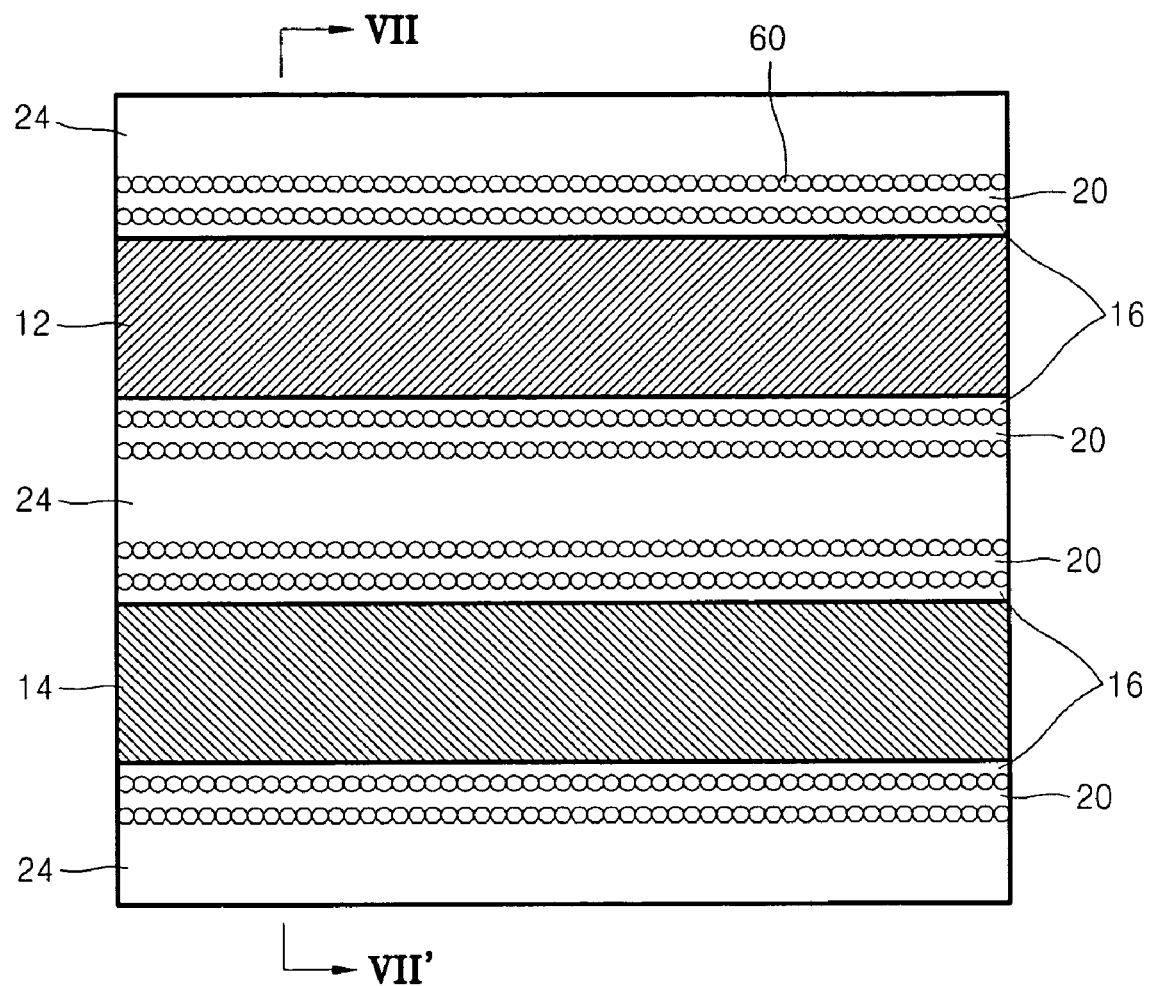
Figure 7:
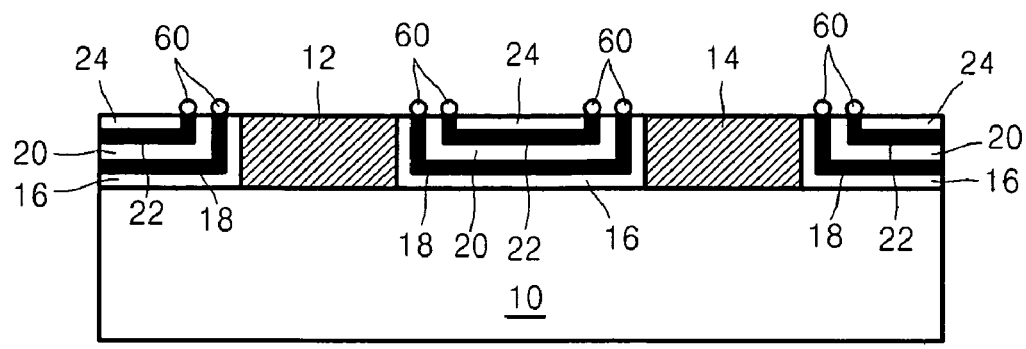

FIG. 6 is a diagram illustrating the results of the vapor-deposition, and FIG. 7 illustrates a section of FIG. 6 cut in direction VII-VII'. Referring to FIG. 6, a polycrystalline nanowire 60 may be formed on the exposed regions of the first and second nanowire forming layers 18 and 22 during the vapor-deposition process. The polycrystalline nanowire 60 may be a poly-silicon nanowire, germanium nanowire and/or silicon germanium nanowire.

Figure 8:
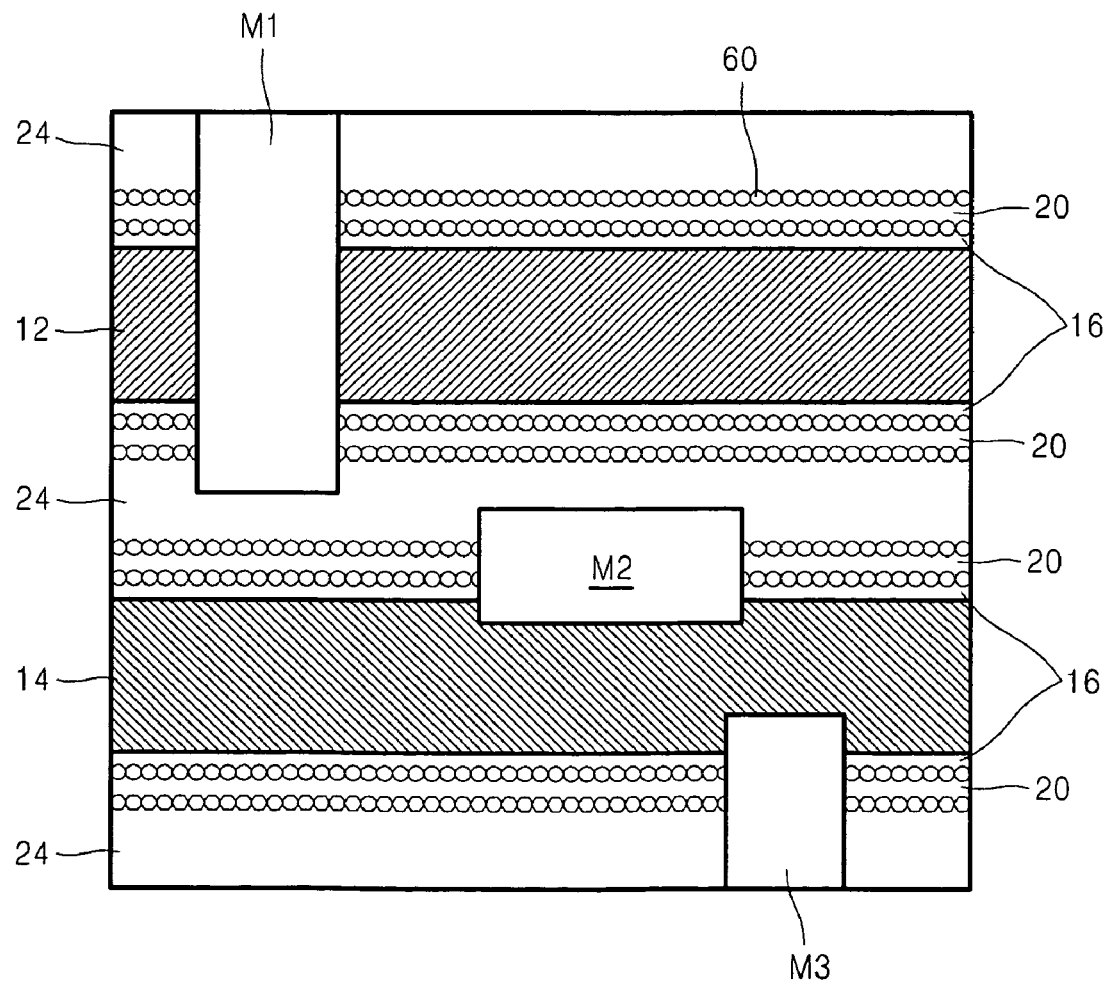

In FIG. 8, first, second and third photosensitive layer patterns M1, M2 and M3 may be formed, for patterning the polycrystalline nanowire 60 at a desired pattern on the level on which the polycrystalline nanowire 60 is formed. The first, second and third photosensitive layer patterns M1, M2 and M3 may be used as etching masks in a subsequent process of etching the polycrystalline nanowire 60. The shapes and positions of the first, second and third photosensitive layer patterns M1, M2 and M3 may be different from one another to be suitable for the shape of devices to be formed. This means that the shapes and positions of the masks may also be different from one another to define the regions where different devices may be formed. After the first, second and third photosensitive layer patterns M1, M2 and M3 are formed, the polycrystalline nanowire 60 around the patterns M1, M2 and M3 may be removed, using the patterns M1, M2 and M3 as the etching masks. The polycrystalline nanowire 60 may be removed from the other regions, except for the first, second and third photosensitive layer patterns M1, M2 and M3 illustrated in FIG. 9.

Figure 9:
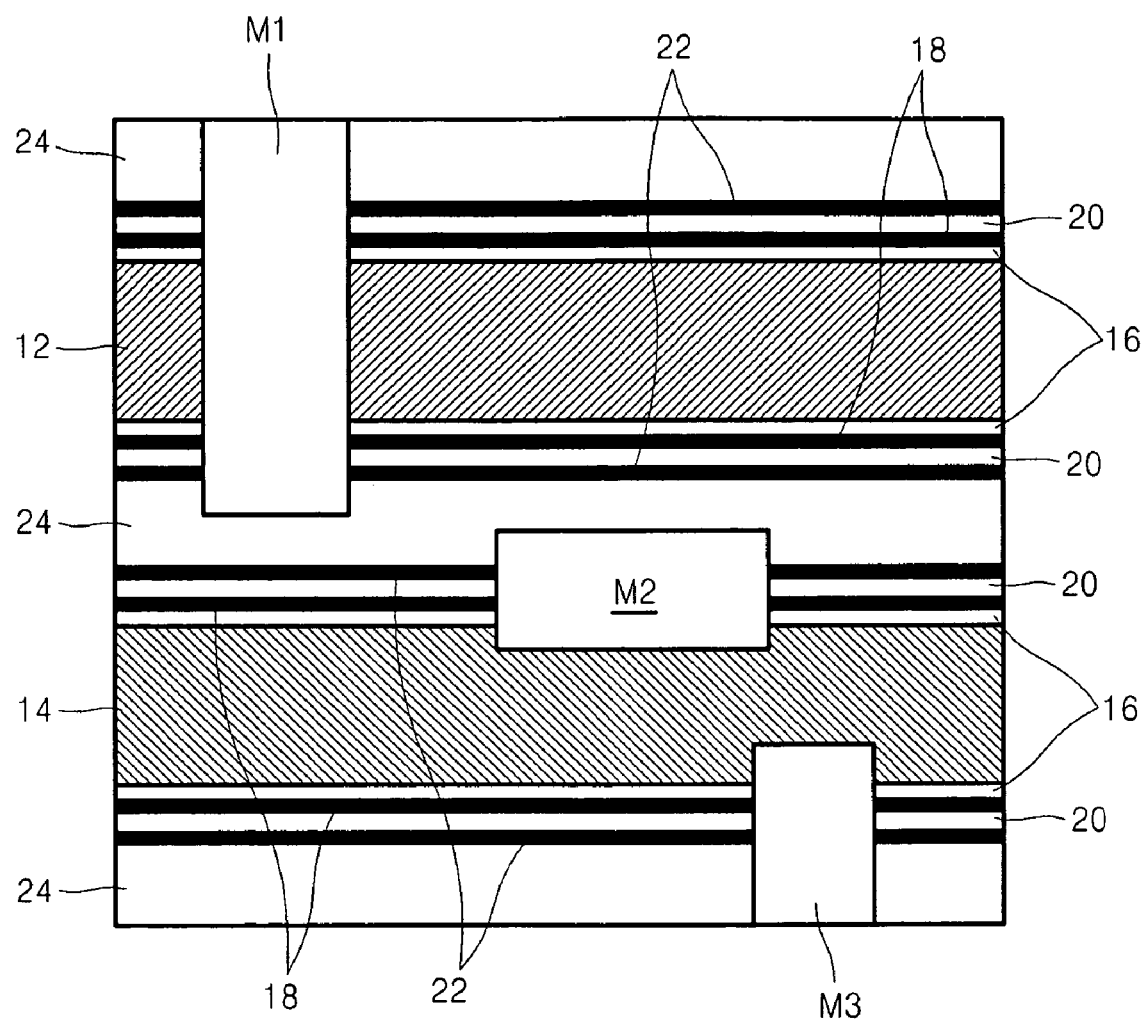
Figure 10:
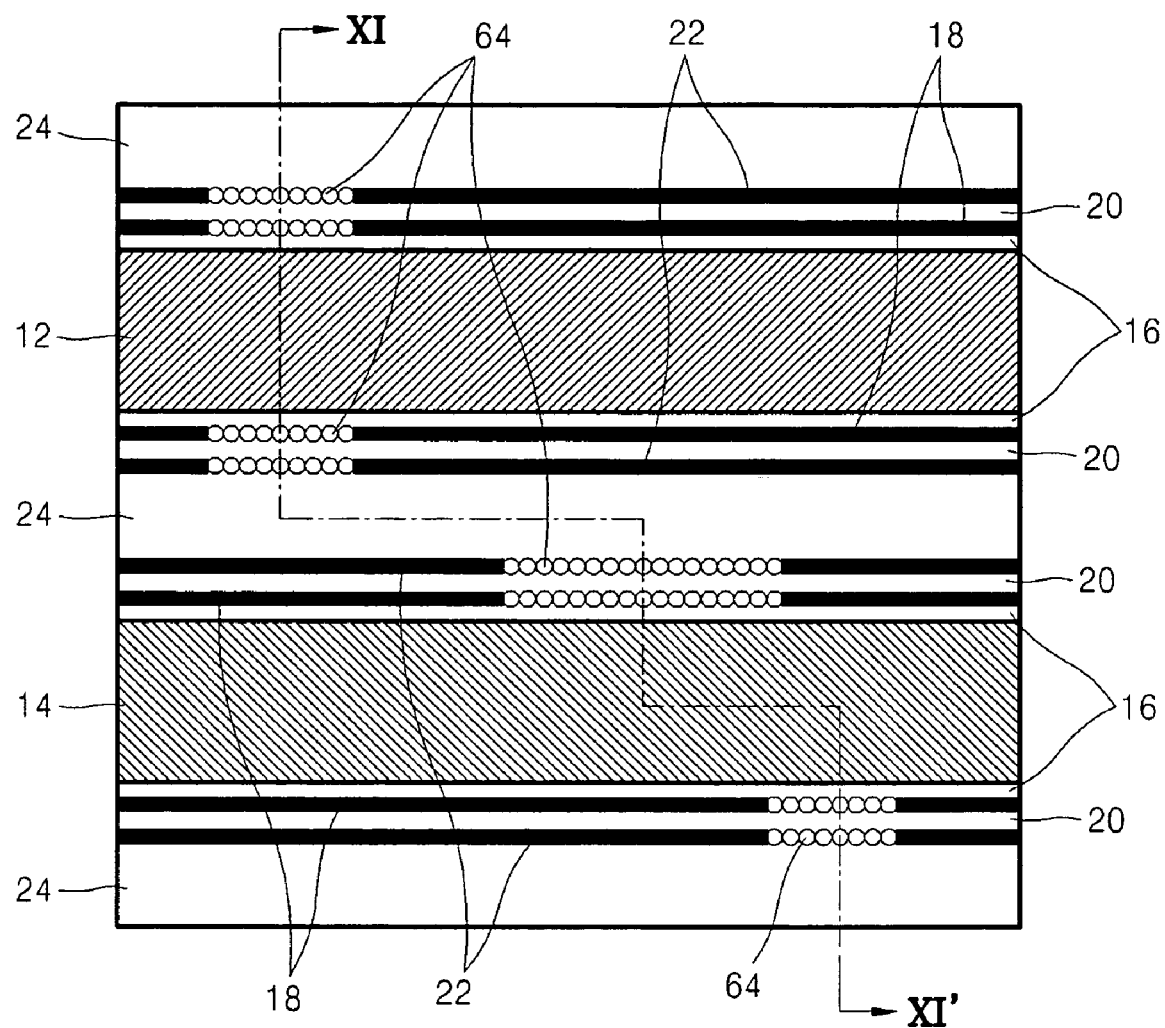

FIG. 10 illustrates the results of removing the first, second and third photosensitive layer patterns M1, M2 and M3 in FIG. 9. Referring to FIG. 10, after the etching process of the polycrystalline nanowire 60 is performed, the polycrystalline nanowire 60 may be distributed in restricted regions only. The shapes and lengths of distribution of the polycrystalline nanowire 60 may vary according to a device using a single crystalline nanowire which is a modification of the polycrystalline nanowire 60.

Figure 11:
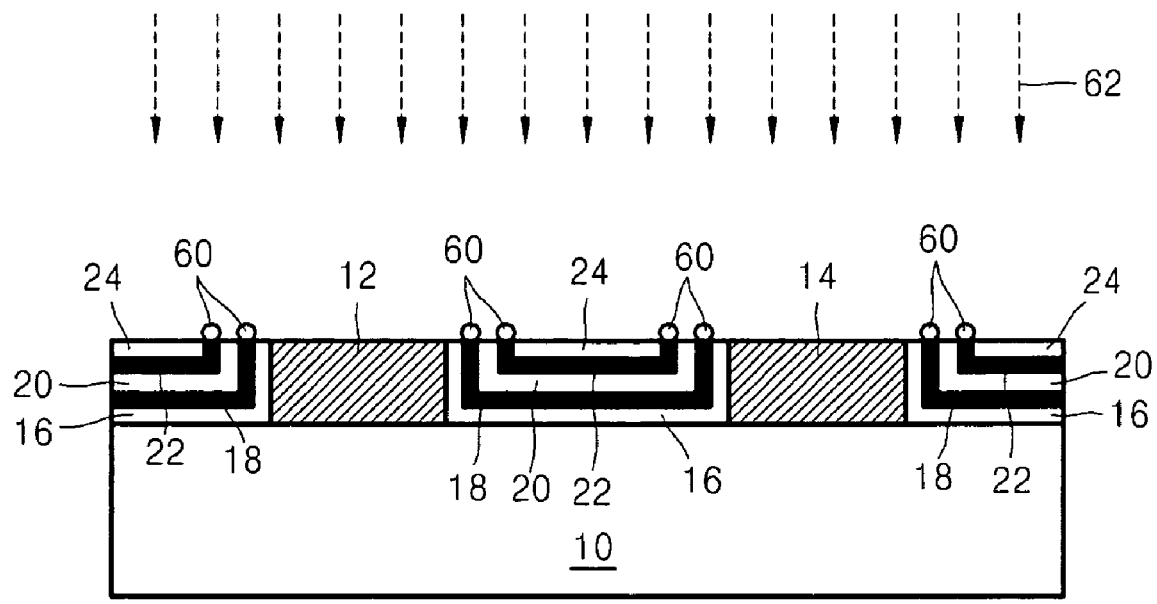

FIG. 11 shows a section of FIG. 10 cut in direction XI-XI'. In FIG. 11, the polycrystalline nanowire 60 at the position where the first, second and third photosensitive layer patterns M1, M2 and M3 are removed, may be subjected to an irradiation of Excimer laser beam 62. The Excimer laser beam 62 may be irradiated in a pulse state. The Excimer laser beam pulse may have the intensity to melt the polycrystalline nanowire 60, but the intensity may be less than the intensity of evaporating the polycrystalline nanowire 60 to be removed or the intensity of agglomerating the polycrystalline nanowire 60. Instead of the Excimer laser beam 62, any other lasers or irradiation units having the equal operation to the Excimer laser beam may be used.

Figure 12:
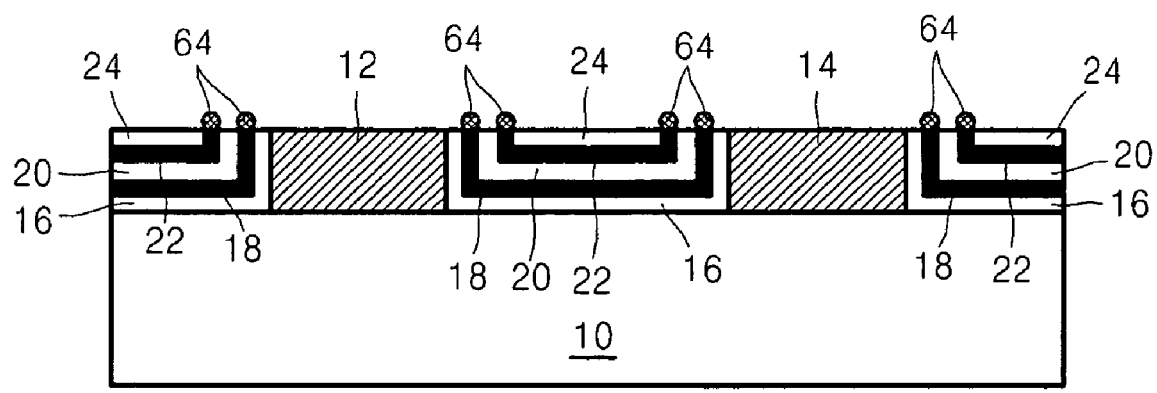

After the Excimer laser beam irradiation, the polycrystalline nanowire 60, which remains at the position where the first, second and third photosensitive layer patterns M1, M2 and M3 are removed, may be changed to a single crystalline nanowire illustrated in FIG. 12. In FIG. 12, reference number 64 denotes the nanowire having a single crystalline structure (hereinafter, referred to as the "single crystalline nanowire 64") resulting from the Excimer laser beam irradiation. The process of changing the polycrystalline nanowire 60 to the single crystalline nanowire 64 during the Excimer laser beam irradiation may be described.

In general, the occurrence event of nucleation for crystal growth in a material may be proportional to the size or surface area of the material. The nucleation may randomly occur. As the size of a material is bigger, the occurrence event of the nucleation may increase. Because the nucleation randomly occurs, a material of increased size may become a polycrystalline state. When the material of increased size is silicon, poly-silicon may be formed. On the contrary, when a material is decreased in size, the occurrence event of the nucleation may decrease and thus a possibility to be a single crystalline may increase.

The occurrence event of the nucleation may be described as a numerical value. For example, the occurrence event of the nucleation in a material of one mole for a nano-second may be about $10^{11}$ events/(mole nsec). For example, when the size of the nanowire is defined as about $30 \times 30 \times 1000$ nm$^3$=$9 \times 10^{-22}$ m$^3$ by the patterning process, the size may be converted into about $7.5 \times 10^{-15}$ moles. The occurrence event of the nucleation in the nanowire of about $9 \times 10^{-22}$ m$^3$ may be about $7.5 \times 10^{-4}$ per nano-second. This value means that the occurrence event of the nucleation in the nanowire of about $9 \times 10^{-22}$ m$^3$ in size may be about 0.75 per micro-second. At least one nucleation may be formed to be crystallized. When the size of the nanowire is smaller, the crystallization may be progressed around the nucleation at the same time when the nucleation occurs. In this regard, it may be inferred that one nucleation occurs in the nanowire, simultaneously the whole nanowire becomes one crystallization, for example, a single-crystallization.

The irradiation of the Excimer laser beam 62 on the polycrystalline nanowire 60, as illustrated in FIG. 11, may be described below. When the polycrystalline nanowire 60 is subjected to the irradiation of the Excimer laser beam 62 adjusted to have an optimum intensity for a relatively short time, the polycrystalline nanowire 60 may be melted to be amorphous and may be subjected to the crystallization process around the nucleation. Because the diameter of the polycrystalline nanowire 60 may be less than about 10 nanometers, the size of the polycrystalline nanowire 60 may be smaller than the size of the nanowire exemplified above. Because the occurrence event of the nucleation in the polycrystalline nanowire 60 is less than about 1, as soon as one nucleation occurs in the amorphous state of the nanowire 60, the whole polycrystalline nanowire 60 may be crystallized around the single nucleation. Consequently, the polycrystalline nanowire 60 may become the single crystalline nanowire 64 while being subjected to irradiation of the Excimer laser beam 62.

Figure 13:
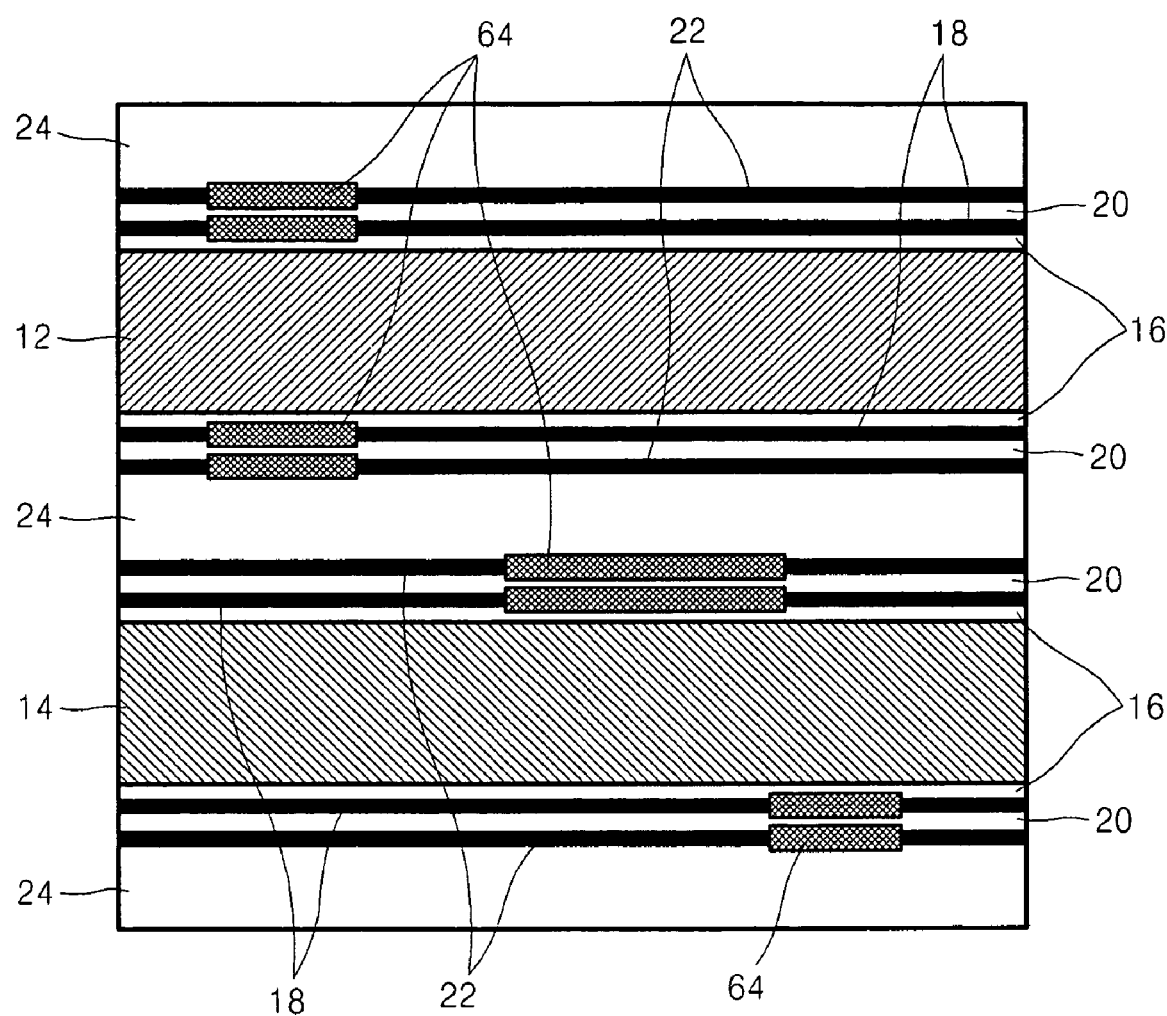

FIG. 13 illustrates a top surface of the resultant after the irradiation of the Excimer laser beam 62 is performed. FIG. 13 is like the result of FIG. 10 subjected to Excimer laser beam irradiation. Referring to FIG. 13, the single crystalline nanowire 64 may exist only on the region covered by the first, second and third photosensitive layer patterns M1, M2 and M3, and it may not exist in any other regions. The process of irradiation of the Excimer laser beam 62 may be performed prior to the process of patterning the polycrystalline nanowire 60. In the resultant illustrated in FIG. 7, the polycrystalline nanowire 60 may change into the single crystalline nanowire 64 by the irradiation of the Excimer laser beam 62 onto the whole polycrystalline nanowire 60. Subsequently, the single crystalline nanowire 64 may be patterned in the manner illustrated in FIG. 13. During the patterning process, the first, second and third photosensitive layer patterns M1, M2 and M3 may be formed to be used as masks.

Figure 14:
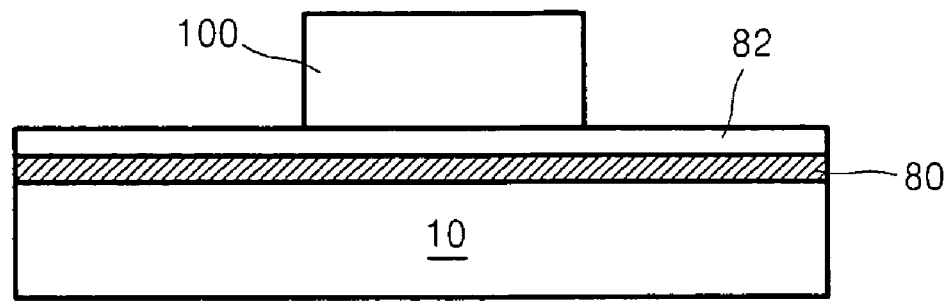

A method of manufacturing a nanowire according to example embodiments may be described with reference to FIGS. 14-20. In this method, mesa patterns may not be used. Referring to FIG. 14, a nanowire forming layer 80 and an insulating layer 82 may be sequentially stacked on a substrate 10. Because the substrate 10 is partially exposed in a subsequent process, it may be composed of a material which does not react to a precursor material used for nanowire formation, or a material which reacts to the precursor material at a slower reaction rate than the reaction rates between the nanowire forming layer 80 and the precursor material. The substrate 10 may be a single layer substrate simply composed of the above-described material, or it may be a stack material which includes a semiconductor device, for example, a transistor, capacitor and/or interconnection inside, and a material layer which does not react to the precursor material as a top material.

The nanowire forming layer 80 may be formed to a thickness of a few nanometers, and it may be formed of the same material as the first nanowire forming layer 18 or the second nanowire forming layer 22 of the example embodiments in FIGS. 1-13. The insulating layer 82 may be formed of the same layer as any one of the first and second insulating layers 16 and 20 of the example embodiments in FIGS. 1-13. A photosensitive layer pattern 100 may be formed on a desired region of the insulating layer 82. The shape of the photosensitive layer pattern 100 may be different according to the shape of the nanowire to be formed. For example, to obtain a long linear nanowire, the photosensitive layer pattern 100 may be formed in a linear shape having a restricted width. To obtain a quadrilateral nanowire, the photosensitive layer pattern 100 may be formed in a square shape. The photosensitive layer pattern 100 may be used as an etching mask, to sequentially etch the insulating layer 82 and the nanowire forming layer 80. The etching may be performed so that the substrate 10 is exposed. After etching, the photosensitive layer pattern 100 may be removed.

Figure 15:
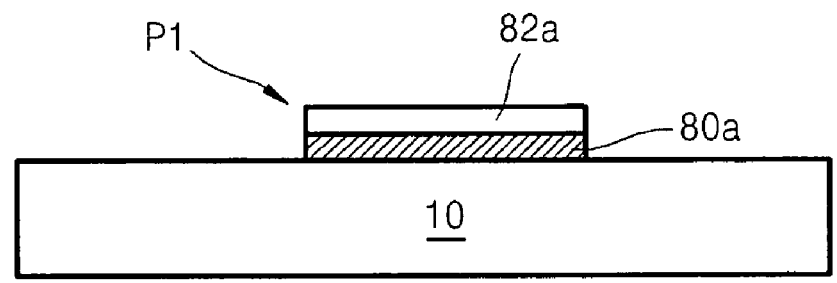
Figure 16:
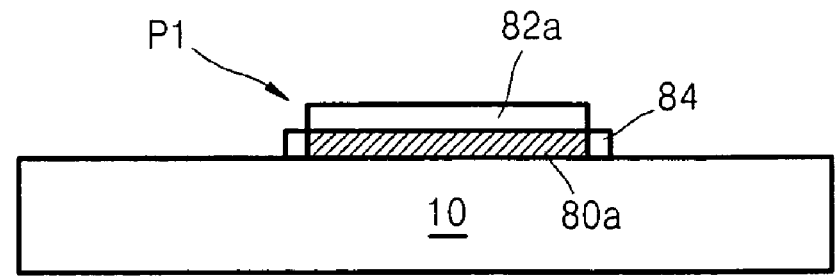
Figure 17:
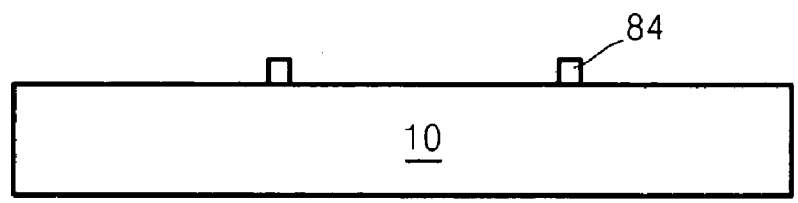

A stack material pattern P1 may be formed on a given region of the substrate 10 illustrated in FIG. 15. The stack material pattern P1 may have the same shape as the photosensitive layer pattern 100 and may include a nanowire forming layer pattern 80a and an insulating layer pattern 82a which are sequentially stacked. Sides of the stack material pattern P1 (e.g., sides of the nanowire forming layer pattern 80a and sides of the insulating pattern 82a) may be exposed. In this state, the resultant of FIG. 15 may be loaded in the UHV-CVD equipment having the conditions described in the example embodiment of FIGS. 1-13. A source gas (precursor gas) for nanowire formation, described in the example embodiments of FIGS. 1-13, may be supplied to the UHV-CVD equipment, thereby a nanowire 84 may be selectively formed on only the sides of the nanowire forming layer pattern 80a illustrated in FIG. 16. Because the thickness of the nanowire forming layer pattern 80a is about a few nanometers, the diameter of the nanowire 84 formed on the sides of the nanowire forming layer pattern 80a may be about a few nanometers. When the nanowire forming layer 80 is thicker, the diameter of the nanowire 84 may increase. When the nanowire forming layer 80 is formed, the thickness of the nanowire forming layer 80 may be controlled, thereby controlling the diameter of the nanowire to be obtained in a subsequent process. The nanowire 84 obtained in the UHV-CVD equipment may not be a single crystalline nanowire. The nanowire 84 may be described as the polycrystalline nanowire 84 hereinafter.

After the polycrystalline nanowire 84 is formed on the sides of the nanowire forming layer pattern 80a, the stack material pattern P1 may be removed from the substrate 10. The stack material pattern P1 may be removed by a wet etching method using a desired etchant having a higher etching rate compared to the insulating layer pattern 82a and the nanowire forming layer pattern 80a and a relatively low etching rate compared to the polycrystalline nanowire 84 and the substrate 10. After the pattern 82a is removed, only the polycrystalline nanowire 84 may remain on the substrate 10 illustrated in FIG. 17.

Figure 18:
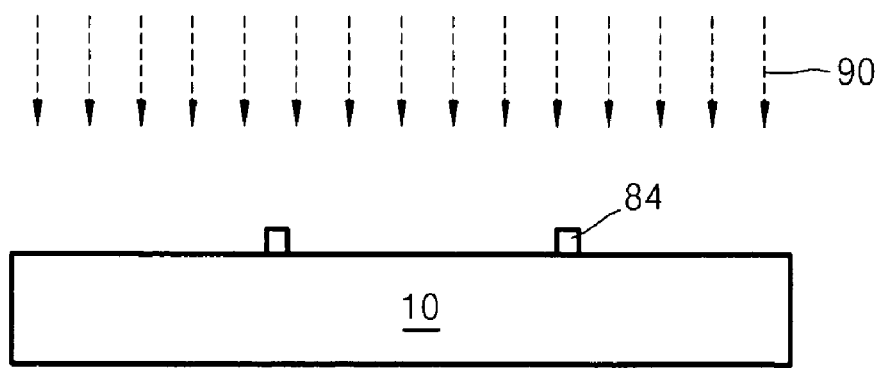

Subsequently, referring to FIG. 18, an Excimer layer light 90 may be irradiated onto the substrate 10 where the polycrystalline nanowire 84 is formed. The Excimer laser beam 90 may be the same kind and may have the same intensity as the Excimer laser beam 62 described in the example embodiments of FIGS. 1-13. Because purposes and conditions of Excimer laser beam 90 irradiation are the same as those of irradiation of the Excimer laser beam 62 of the example embodiments of FIGS. 1-13, any further description thereof may be omitted. The polycrystalline nanowire 84 may become a single crystalline nanowire 84a by Excimer laser beam 90 irradiation, as illustrated in FIG. 19.

Figure 19:
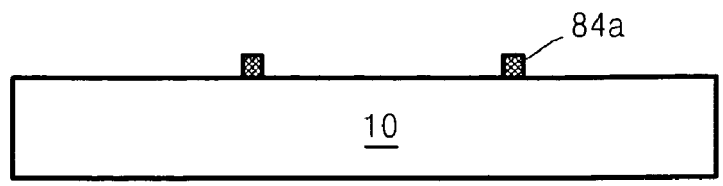
Figure 20:
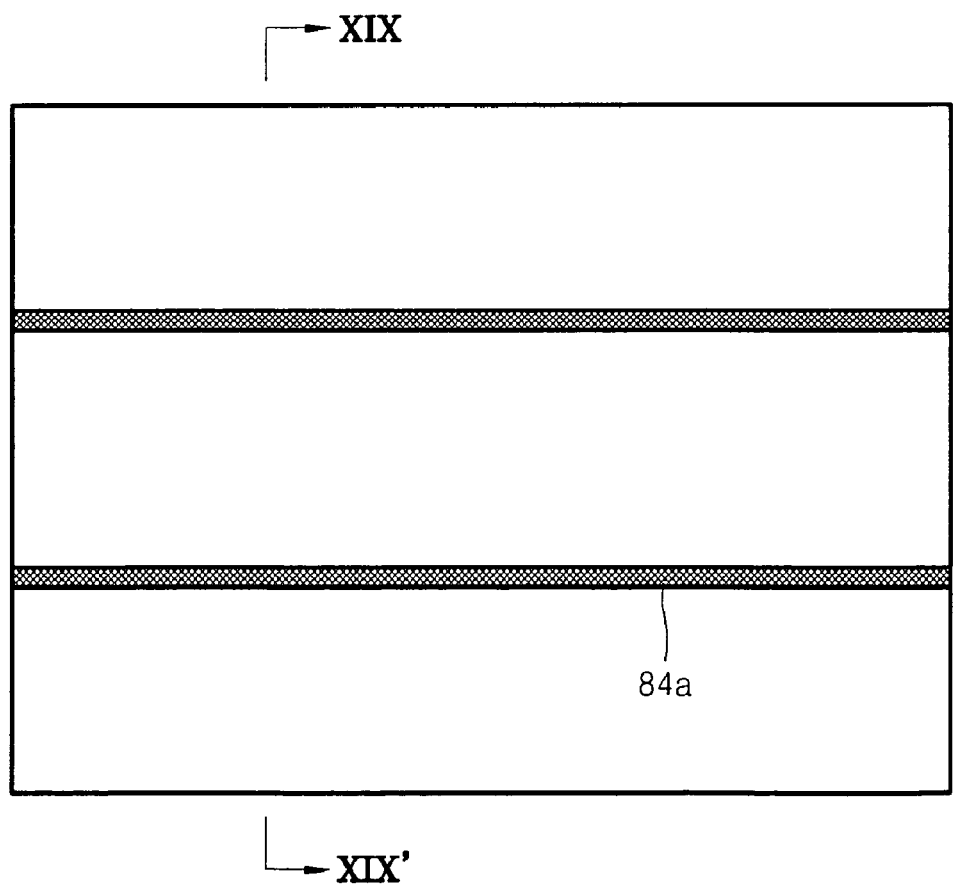

FIG. 20 shows a plane of the resultant of FIG. 19. FIG. 19 shows a section of FIG. 20 cut in direction XIX-XIX'. Referring to FIG. 20, the single crystalline nanowire 84a may be linearly formed in parallel. In the method of manufacturing a nanowire according to the example embodiments of FIGS. 14-20, the process of Excimer laser beam 90 irradiation may be performed after the polycrystalline nanowire 84 is formed and before the stack material pattern P1 is removed.

As described above, in the method of manufacturing a nanowire according to example embodiments, a catalyst may not be used and a nanowire may be selectively formed, thereby impurities may not be included in a nanowire finally obtained. A position where a nanowire is to be formed may be optionally selected and the formed nanowire may be cut at a desired length by using the existing photolithography and etching processes, thereby enabling nanowires applied to various devices. The nanowire of example embodiments may be selectively formed on the exposed section of a specific material layer (e.g., nanowire forming layer), thereby easily forming nanowires with various diameters (about 1 nm-about 100 nm) according to the thickness of the specific material layer.

Because current semiconductor fabrication process equipment is used, manufacturing cost may be reduced. Because the nanowire of example embodiments is selectively grown in a specific material layer only, any additional masks may not be necessary to determine a region for forming a nanowire and thus a manufacturing process may be simplified. The substrate used during the process of manufacturing the nanowire may not directly influence the formation of the nanowire. Various substrates, for example, a crystalline substrate and/or an amorphous substrate, may be used. The single crystalline nanowire may be relatively easily obtained.

While example embodiments have been particularly shown and described with reference to exemplary embodiments thereof, it should not be construed as being limited to the embodiments set forth herein. Rather, it will be understood by those of ordinary skill in the art that various changes in form and details may be made therein. For example, the thickness of the first nanowire forming layer 18 and the thickness of the second nanowire forming layer 22 may be different according to the example embodiments of FIGS. 1-13, thereby forming the single crystalline nanowire having different diameters simultaneously. Thus, the spirit and scope of example embodiments should be defined by the following claims.

What is claimed is:

1. A method of manufacturing a semiconductor apparatus including a single crystalline nanowire comprising:
    forming a material layer pattern on a substrate;
    forming a first insulating layer covering the material layer pattern, a first nanowire forming layer and a top insulating layer on the substrate, wherein a total depth of the first insulating layer and the first nanowire forming layer is formed to be smaller than a depth of the material layer pattern;
    polishing the top insulating layer, the first nanowire forming layer and the first insulating layer so that the material layer pattern is exposed, and exposing part of the first nanowire forming layer to form an exposed region; and
    forming the single crystalline nanowire on the exposed region of the first nanowire forming layer.

2. The method of claim 1, wherein the substrate includes one selected from the group consisting of a silicon oxide, quartz and glass.

3. The method of claim 1, wherein forming the first insulating layer includes forming the first insulating layer composed of a material having a lower reaction rate to a source gas used for single crystalline nanowire formation, than a reaction rate of the first nanowire forming layer.

4. The method of claim 1, wherein forming the first nanowire forming layer includes forming a silicon nitride layer.

5. The method of claim 1, wherein forming the first insulating layer, the first nanowire forming layer and the top insulating layer further includes:
    forming a second insulating layer and a second nanowire forming layer between the first nanowire forming layer and the top insulating layer, wherein a total depth of the first insulating layer, the first nanowire forming layer, a second insulating layer and a second nanowire forming layer is formed to be smaller than a depth of the material layer pattern.

6. The method of claim 5, wherein forming the second insulating layer includes forming the second insulating layer composed of a material having a lower reaction rate to a source gas used for the single crystalline nanowire formation, than a reaction rate of the second nanowire forming layer.

7. The method of claim 5, wherein forming the second nanowire forming layer includes forming a silicon nitride layer.

8. The method of claim 1, wherein forming the first nanowire forming layer includes forming the first nanowire forming layer to a thickness within the range of about 1 nm-about 100 nm.

9. The method of claim 5, wherein forming the second nanowire forming layer includes forming the second nanowire forming layer to a thickness within the range of about 1 nm-about 100 nm.

10. The method of claim 5, wherein forming the first nanowire forming layer and the second nanowire forming layer includes forming the first nanowire forming layer and the second nanowire forming layer at different thicknesses.

11. The method of claim 1, wherein forming the single crystalline nanowire includes forming the single crystalline nanowire from one selected from the group consisting of a silicon (Si) nanowire, a germanium (Ge) nanowire and a silicon germanium (SiGe) nanowire.

12. The method of claim 5, wherein forming the single crystalline nanowire includes forming the single crystalline nanowire from one selected from the group consisting of a silicon (Si) nanowire, a germanium (Ge) nanowire and a silicon germanium (SiGe) nanowire.

13. The method of claim 1, wherein forming the exposed region of the first nanowire forming layer includes forming the exposed region with a length and a nano-width.

14. The method of claim 1, wherein forming the single crystalline nanowire further includes:
    forming a polycrystalline nanowire on the exposed region of the first nanowire forming layer; and
    irradiating a laser beam to the polycrystalline nanowire.

15. The method of claim 14, wherein forming the polycrystalline nanowire includes supplying a precursor including a group IV semiconductor element as a source gas in ultrahigh vacuum chemical vapor deposition equipment.

16. The method of claim 1, wherein forming the material layer pattern includes forming at least two material layer patterns spaced apart from each other on the substrate.

17. The method of claim 14, wherein irradiating the laser beam includes irradiating the laser beam to a remaining part of the polycrystalline after removing a part of the polycrystalline nanowire.

18. The method of claim 14, wherein irradiating the laser beam includes removing a part of the single crystalline nanowire after irradiating the laser beam to the polycrystalline.

* * * * *